United States Patent
Hollingsworth

[15] 3,652,947
[45] Mar. 28, 1972

[54] POWER AMPLIFIER INCLUDING PLURALITY OF PUSH-PULL AMPLIFIER SECTIONS HAVING OUTPUTS COUPLED IN PARALLEL

[72] Inventor: Gale C. Hollingsworth, Addison, Ill.

[73] Assignee: Motorola, Inc., Franklin Park, Ill.

[22] Filed: Feb. 24, 1970

[21] Appl. No.: 13,322

[52] U.S. Cl. ....... 330/15, 330/118, 330/122
[51] Int. Cl. ....... H03f 3/26
[58] Field of Search ....... 325/127, 171, 172; 330/15, 330/30, 118, 122, 165, 166, 171, 188, 190, 195, 197; 336/147, 233

[56] References Cited

UNITED STATES PATENTS

| | | | |
|---|---|---|---|
| 3,256,490 | 6/1966 | Gohm | 330/15 |
| 3,471,796 | 10/1969 | Wright | 330/31 X |
| 2,452,529 | 10/1948 | Snoek | 336/233 X |
| 3,102,984 | 9/1963 | Locanthi | 330/15 X |

OTHER PUBLICATIONS

J. W. Flowers " Parallel Output Push-Pull Circuit;" Electronics pp 152- 154 April 1952

*Primary Examiner*—Roy Lake
*Assistant Examiner*—Lawrence J. Dahl
*Attorney*—Mueller & Aichele

[57] ABSTRACT

A high power semiconductor amplifier, which may be used as the power amplifier of a radio transmitter, includes a plurality of push-pull amplifier sections cooperating to provide the required output power. The amplifier sections are coupled by broadband transformers having ferrite cores and a plurality of inter-wound coils. This affords direct current isolation of the sections and a high degree of coupling as required for broadband operation and provides stable high gain operation with the signals in the two amplifier sections being in very close phase relationship so that they can be combined in-phase for maximum efficiency. The coupling circuit at the output of the sections includes the secondary windings of the transformers connected in parallel circuit branches extending from the reference potential to the output line to reduce the effect of stray reactances. The amplifier is usable over a wide range of frequencies with a minimum of adjustment.

6 Claims, 1 Drawing Figure

PATENTED MAR 28 1972
3,652,947
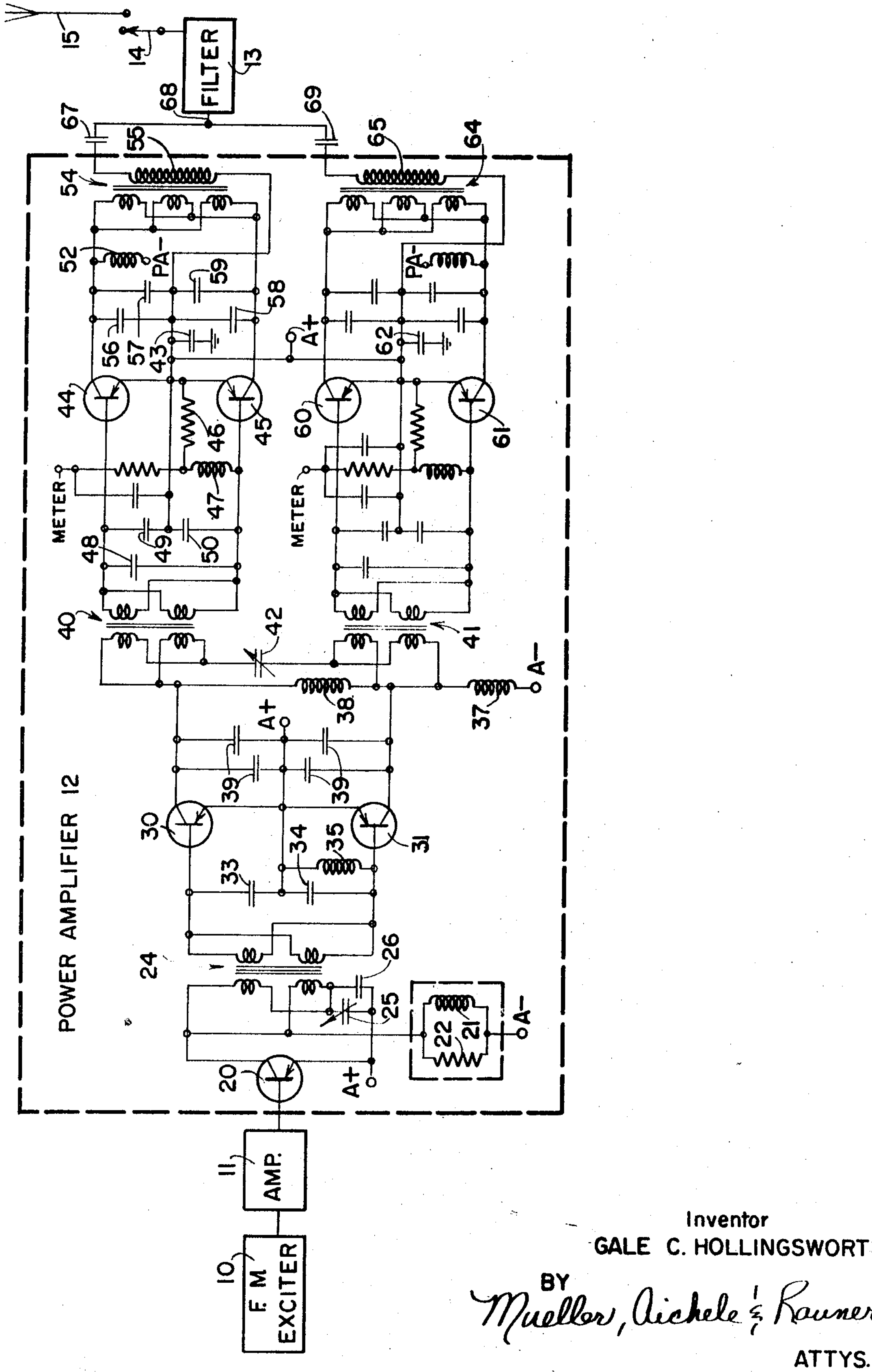
Inventor
GALE C. HOLLINGSWORTH
BY
Mueller, Aichele & Rauner
ATTYS.

POWER AMPLIFIER INCLUDING PLURALITY OF PUSH-PULL AMPLIFIER SECTIONS HAVING OUTPUTS COUPLED IN PARALLEL

BACKGROUND OF THE INVENTION

Electronic equipment, such as radio transmitters, have used semiconductor devices, such as transistors, as amplifiers with a resulting saving in size and power consumption, and with improved reliability. There has been a problem, however, in the use of a plurality of transistor amplifier stages in multiple to provide high power output. It has been proposed to use a plurality of transistors in parallel, but in such use there is a problem that the transistors will have slight variations in characteristics which may cause the transistors to share the load unevenly. To prevent this from happening additional circuit elements are required for balancing, and adjustable tuning controls are required which increase the complexity and cost of the circuit. It has also been proposed to use a plurality of separate transistor amplifier and couple the outputs to provide increased power. It is difficult, however, to maintain the phase of the signals in the amplifiers the same so that when the output signals are combined, these signals are added in-phase to provide the maximum output.

Another problem which has been encountered is to provide a power amplifier which can be used at different frequencies in a wide frequency range. For example, it is desired to provide a transistor amplifier which can be used as the power amplifier of a radio transmitter which operates in the 150 to 174 megahertz range. It is desired to cover this range with no more than two different amplifier constructions, and that a minimum of tuning adjustments are required to provide any frequency within the range of each amplifier.

Because of the above and other problems it has not been possible to provide stable broadband amplifiers wherein the maximum possible output is obtained from the use of a plurality of transistor amplifiers, the currents of which are combined to provide the load current. Further, circuits which have been provided for such applications have been complex and expensive.

SUMMARY OF THE INVENTION

It is an object of the present invention to provide a power amplifier including a plurality of isolated amplifier section each having one or more semiconductor devices, with the outputs of the amplifier sections being coupled in parallel to provide an output which is substantially the sum of the maximum outputs of all of the devices.

Another object of the invention is to provide an improved coupling circuit for a plurality of amplifier stages to couple the same to a driving source and to a load, and which provides direct current isolation between the amplifier sections so that they may be balanced or unbalanced with respect to an electrical reference.

A further object of the invention is to provide a simple and inexpensive coupling circuit for a pair of push-pull transistor amplifier sections, including a close coupled ferrite transformer at the output of each section and a coupling circuit connecting the secondary windings of the two transformers in parallel between a reference potential and an output terminal.

In accordance with the invention, a high power semiconductor amplifier is provided which is suitable for use as a power amplifier in a radio transmitter. The amplifier will be described as used in a radio transmitter for operation in the 150 to 174 megahertz range. The power amplifier includes a plurality of broadband push-pull transistor amplifier sections which are coupled to a drive circuit and an output circuit by transformers so that DC isolation is provided. The transformers have ferrite cores and close coupled windings to provide effective stable operation over wide bandwidths, and to control the phase of the signals in the two amplifier sections so that the outputs can be efficiently combined. The coupling circuit at the inputs of the amplifier sections is provided by a series circuit including windings of the transformers coupled to the two sections and a variable reactance for tuning the same. The coupling circuit at the outputs of the amplifier sections connects the secondary windings of the broadband transformers in parallel between the reference potential and an output line. Only the variable reactance in the series input circuit and a variable reactance in the driver stage of the amplifier must be adjusted to set the amplifier for operation at any frequency in a twelve megahertz range in the region of 150 to 174 megahertz. By use of the close coupling of the transformers and by properly balancing the push-pull sections, the stability over a broadband is increased and the signals in the two sections are held in close phase relationship so that they can be combined in-phase and the maximum power capacity of the transistors of both pull-push sections is effectively utilized to provide the amplifier output.

BRIEF DESCRIPTION OF THE DRAWING

The single FIGURE of the drawing is a schematic diagram of a radio transmitter for operating in a frequency range from 150 to 174 megahertz including the power amplifier of the invention.

DETAILED DESCRIPTION

The amplifier of the invention is illustrated in the drawing in a FM radio transmitter. The transmitter includes an exciter 10 wherein a carrier wave is generated, and its frequency is modulated in accordance with audio or other modulating signals. The frequency modulated wave from exciter 10 is amplified in amplifier 11 which serves to isolate the exciter from the power amplifier, and which may be controlled to control the level of the signals applied to the power amplifier to prevent overloading the same. The output of the amplifier 11 is applied to power amplifier 12, the complete circuit diagram for which is shown and will be described. The output of the amplifier 12 is applied through harmonic filter 13 to antenna 15. A switch 14 is shown for connecting the filter 13 to the antenna 15, as may be used when the transmitter is connected to the same antenna as a receiver. The switch 14 is shown connecting the transmitter power amplifier to the antenna 15, but may be operated to the dotted position for connecting the antenna 15 to a receiver.

Considering now the specific circuit of the power amplifier 12, the signal from amplifier 11 is applied to the base electrode of PNP-transistor 20 which forms a predriver stage for the power amplifier. The emitter of the transistor 20 is connected to the A+ terminal which forms the reference potential for the amplifier. This terminal is heavily bypassed to the chassis ground, and is ground potential with respect to radio frequency (RF) signals. Negative potential is applied from A— terminal through parallel connected choke 21 and resistor 22 to the collector electrode of transistor 20. The output is derived between the collector and emitter electrodes by the circuit including transformer 24 and tuning capacitor 25. Fixed capacitor 26 is connected in parallel with tuning capacitor 25. The transformer 24 includes a pair of parallel connected primary windings and a pair of parallel connected secondary windings on a ferrite core. To match the impedance of the transistors, the windings must have low impedance and this is facilitated by connecting the windings in parallel. To provide the required coupling, the windings are closely related on the ferrite core, being interwound on the core with each primary winding closely coupled to both secondary windings to provide maximum coupling therebetween for stable broadband operation. The transformers also isolate the unbalanced single ended predriver stage from the following balanced push-pull driver amplifier stage.

The driver stage of the power amplifier 12 includes PNP-transistors 30 and 31 connected in a push-pull circuit. The emitters of transistors 30 and 31 are connected to the A+ terminal, which as previously stated represents ground potential with respect to RF signals. The secondary windings of transformer 24 are connected to the base electrodes of transistors 30 and 31 to provide signals thereto in opposite phases. Capacitors 33 and 34 stabilize the circuit and balance the input to the two transistors, and also affect the impedance match to the base electrodes. Bias potential is applied from the A+ terminal through DC feed choke 35 to the base electrode of transistor 31, and through the secondary windings of transformer 24 to the base electrode of transistor 30. A− potential is applied through choke 37 to the collector of transistor 31, and through chokes 37 and 38 to the collector electrode of transistor 30.

The output circuit of the driver amplifier is connected between the collector electrodes of transistors 30 and 31. This circuit includes the primary windings of transformers 40 and 41 connected in series with variable capacitor 42. The transformers 40 and 41 may be of the same construction as transformer 24, with a ferrite core and parallel connected interwound primary and secondary windings. Capacitors 39 connected between the collectors of transistors 30 and 31 and the A+ terminal increase the gain stability and balance the sides of the push-pull circuit.

The final power amplifier is formed by two push-pull transistor amplifier sections. The secondary windings of transformer 40 supply drive signals to the base electrodes of transistors 44 and 45, which are coupled to form a first push-pull transistor power amplifier section. The emitter electrodes of the PNP-transistors 44 and 45 are connected to the A+ potential in the same manner described with respect to transistors 30 and 31. A further filter condenser 43 is connected from the A+ line to ground. Bias potential is applied from the A+ potential through resistor 46 and choke 47 to the base electrode of transistor 45, and through the secondary windings of transformer 40 to the base electrode of transistor 44. Fixed capacitor 48 is connected across the parallel connected secondary windings of transformer 40 for stabilizing and tuning the same, and fixed capacitors 49 and 50 are connected between the base electrodes and the emitter electrodes of transistors 44 and 45 for stability and balance. Meter connections to the amplifier sections are shown, but these are not described as they do not affect the circuit operation.

The output of the first push-pull amplifier section is derived between the collector electrodes of transistors 44 and 45 by transformer 54. This transformer has three parallel connected primary windings each connected between the two collector electrodes. Operating potential is applied to the collector electrode of transistor 44 from terminal PA− through choke 52. The potential applied at terminal PA− has additional filtering with respect to the potential applied at terminal A−. The collector potential for transistor 45 is applied from terminal PA− through choke 52 and the primary windings of transformer 54. Capacitors 56, 57, 58 and 59 are all fixed capacitors which increase stability, and provide balancing and impedance matching functions.

The second push-pull amplifier section of the power amplifier 12 is formed by the circuit including transistors 60 and 61. The base electrodes of these transistors are connected to the secondary windings of transformer 41. The circuit of this second section may be identical to the circuit of the first push-pull section, which has been described, and this description will not be repeated. The output of the second push-pull section is applied to transformer 64 which has three parallel connected primary windings as described for transformer 54. Each of the transformers 54 and 64 has a ferrite core on which the windings are wound, and each primary winding is closely coupled to a portion of the secondary winding of the transformer.

The outputs of the two push-pull power amplifier sections is obtained by connecting the secondary windings 55 and 65, of transformers 54 and 64 respectively, in parallel to a 50-ohm line 68. Winding 55 is connected in the series circuit from ground including capacitors 43 and 67 to output line 68, and winding 65 is connected in the series circuit from ground including capacitors 62 and 69 to output line 68. It is necessary that the output impedance of each secondary winding 55 and 65 be of the order of 100 ohms so that the impedance of the two windings in parallel will match the 50-ohm line. This impedance step-up can be accomplished because the ground return for each secondary winding 55 and 65 is short and this keeps the stray inductances low, and permits the use of more turns in the secondary windings 55 and 65 to increase the impedance and the coupling. The combination of the outputs of the two secondary windings at the relatively high impedance level of 100 ohms is of primary importance in reducing the effects of stray reactances in the output circuit, which are normally very detrimental to the achievement of broadband characteristics. This causes the output circuit to have an extremely broad bandwidth and permits the elimination of output tuning controls. The circuit with grounded secondary windings also provides better symmetry between the two amplifier sections for more precise phase relation of the two outputs.

Because of the close coupling and low leakage inductance afforded by the transformers 24, 40 and 41, and by the balanced and stable operation of the push-pull amplifiers, broadband operation is enhanced. As the signals in the windings 55 and 65 are very accurately in-phase, these signals are added to provide maximum output to line 68. This output is applied through filter 13 to the antenna 15 of the transmitter, as previously described.

The amplifier of FIG. 1 is for use in the 150 to 174 megahertz frequency range. The transformers 24, 40 and 41 have impedances of the order of 4 to 6 ohms to properly match the transistor stages for efficient operation. The transformers 54 and 64 have input impedances of about 6 ohms and output impedances of about 100 ohms. The only elements which are adjustable for tuning the amplifier for operation at different frequencies are the variable capacitor 25 in the predriver coupling circuit and capacitor 42 in the series coupling circuit between the driver amplifier and the two push-pull power amplifier sections. By adjustment of these two elements of the amplifier, stable operation is provided at any frequency in a frequency range of 12 megahertz, in the frequency region from 150 to 174 megahertz.

The amplifier circuit which has been described has been thoroughly tested and found to be highly satisfactory. This permits the construction of a radio transmitter which is usable at a plurality of different frequencies, so that the manufacturing cost is much less than if several different transmitters were required to provide operation at these frequencies. Since only two tuning controls must be adjusted to condition the amplifier for operation at the different frequencies, this can be easily accomplished.

I claim:

1. A power amplifier circuit for operation in the frequency range of the order of 150 megahertz and above, and for amplifying the signal at an input terminal to provide a larger signal at an output terminal including in combination, a plurality of amplifier sections each having a pair of transistors connected in push-pull and an input circuit portion and an output circuit portion, a plurality of first wide band transformers each having a ferrite core and closely coupled primary and secondary winding means on said core, said input circuit portion of each amplifier section including said secondary winding means of one of said first transformers, a first circuit connected to said input terminal including said primary winding means of all of said first transformers, a plurality of second wide band transformers each having a ferrite core and closely coupled primary and secondary winding means, said primary winding means of each of said second transformers being connected in the output circuit portion of one of said amplifier sections, and a second circuit connecting said secondary winding means of said second transformers in parallel between a reference potential and the output terminal, said first and second circuits providing direct current isolation of said amplifier sections and holding the signals therein substantially in-phase.

2. A power amplifier circuit in accordance with claim 1 wherein said second transformers each include an elongated rod core and a plurality of primary windings connected in parallel and a secondary winding having a plurality of portions, with each of said primary windings being closely coupled to a portion of said secondary winding.

3. A power amplifier circuit in accordance with claim 2 including first and second amplifier sections each having a pair of transistors connected in push-pull and circuit means providing stable wide band operation thereof, and wherein each of said first transformers includes an elongated ferrite core having a pair of parallel connected primary windings and a pair of parallel connected secondary windings thereon, with each of said primary windings being closely coupled to both of said secondary windings.

4. A power amplifier circuit in accordance with claim 1 wherein said first circuit includes said primary winding means of said first transformers connected in series with a variable tuning capacitor.

5. A power amplifier circuit in accordance with claim 4 further including a driver amplifier coupled to said first circuit for applying signals thereto.

6. A power amplifier circuit in accordance with claim 5 wherein said driver amplifier is a push-pull transistor amplifier, and further including a single ended predriver transistor amplifier coupled to said driver amplifier by a coupling circuit including a further transformer having a ferrite core and closely coupled windings thereon, with said coupling circuit further including a variable tuning capacitor which together with the variable tuning capacitor connected in series with the primary winding means of said first transformers constitute the only elements of the power amplifier circuit which must be adjusted for operation at different frequencies in a wide frequency range.

* * * * *